United States Patent
Li et al.

(10) Patent No.: US 7,338,907 B2
(45) Date of Patent: Mar. 4, 2008

(54) SELECTIVE ETCHING PROCESSES OF SILICON NITRIDE AND INDIUM OXIDE THIN FILMS FOR FERAM DEVICE APPLICATIONS

(75) Inventors: Tingkai Li, Vancouver, WA (US); Sheng Teng Hsu, Camas, WA (US); Bruce D. Ulrich, Beaverton, OR (US); Mark A. Burgholzer, Amboy, WA (US); Ray A. Hill, Vancouver, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 187 days.

(21) Appl. No.: 10/958,537

(22) Filed: Oct. 4, 2004

(65) Prior Publication Data

US 2006/0073706 A1   Apr. 6, 2006

(51) Int. Cl.
    *H01L 21/311* (2006.01)

(52) U.S. Cl. ............ 438/724; 438/588; 438/592; 438/631; 438/633; 438/645; 438/723; 216/67; 216/72; 216/79; 257/295; 257/310; 257/369; 257/752

(58) Field of Classification Search ............ 216/67; 257/295; 438/645
    See application file for complete search history.

(56) References Cited

U.S. PATENT DOCUMENTS

| | | |
|---|---|---|
| 4,568,410 A | 2/1986 | Thornquist |
| 4,574,177 A | 3/1986 | Wang |
| 4,654,114 A | 3/1987 | Kadomura |
| 4,832,787 A | 5/1989 | Bondur et al. |
| 5,318,664 A | 6/1994 | Saia et al. |
| 5,621,681 A * | 4/1997 | Moon .................. 365/145 |
| 5,786,276 A | 7/1998 | Brooks et al. |
| 5,843,277 A | 12/1998 | Goto et al. |
| 5,928,967 A | 7/1999 | Radens et al. |
| 6,036,876 A | 3/2000 | Chen et al. |
| 6,051,504 A | 4/2000 | Armacost et al. |
| 6,060,400 A | 5/2000 | Oehrlein et al. |
| 6,274,421 B1 | 8/2001 | Hsu et al. |
| 6,372,657 B1 | 4/2002 | Hineman et al. |
| 6,436,841 B1 | 8/2002 | Tsai et al. |
| 6,461,529 B1 | 10/2002 | Boyd et al. |
| 6,656,375 B1 | 12/2003 | Armacost et al. |
| 6,716,759 B2 | 4/2004 | Pecora |
| 6,756,313 B2 | 6/2004 | Choi et al. |
| 7,067,329 B2 * | 6/2006 | Lee ...................... 438/3 |
| 2002/0175144 A1 * | 11/2002 | Hung et al. ............ 216/67 |
| 2005/0101113 A1 * | 5/2005 | Brask et al. ........... 438/585 |
| 2006/0022277 A1 * | 2/2006 | Kavalieros et al. .... 257/369 |

* cited by examiner

*Primary Examiner*—Nadine G. Norton
*Assistant Examiner*—Maki Angadi
(74) *Attorney, Agent, or Firm*—Robert Varitz; Sharp Laboratories of America, Inc.

(57) ABSTRACT

A dry etch process is described for selectively etching silicon nitride from conductive oxide material for use in a semiconductor fabrication process. Adding an oxidant in the etch gas mixture could increase the etch rate for the silicon nitride while reducing the etch rate for the conductive oxide, resulting in improving etch selectivity. The disclosed selective etch process is well suited for ferroelectric memory device fabrication using conductive oxide/ferroelectric interface having silicon nitride as the encapsulated material for the ferroelectric.

30 Claims, 9 Drawing Sheets

SELECTIVE ETCHING PROCESSES OF SILICON NITRIDE AND INDIUM OXIDE THIN FILMS FOR FERAM DEVICE APPLICATIONS

FIELD OF THE INVENTION

This invention relates in general to selective etching of silicon nitride relative to conductive oxide, and particularly to improved methods for integrated processes of ferroelectric non-volatile memory devices.

BACKGROUND OF THE INVENTION

Ferroelectric materials are composed of many randomly-distributed permanently polarized regions. Under the presence of an electric field, the regions with a polarization component in the direction of the electric field grow at the expense of the non-aligned regions so that a net polarization can result. If the electric field decreases, the polarization also decreases but at a slower rate so that even when the electric field becomes zero, a remnant polarization remains. This remnant polarization, existed under zero field condition (i.e., when power is turned off), is the basis of ferroelectric nonvolatile memory devices such as ferroelectric transistors.

The ferroelectric transistor is typically a ferroelectric-gate-controlled semiconductor field-effect transistor (FET), which employs a ferroelectric film in contact with a silicon substrate, and in which a proper polarization of the ferroelectric film can create an inversion layer in the silicon channel of the transistor. The basic ferroelectric-gate controlled field-effect transistor is a metal-ferroelectric silicon (MFS) FET. The term MFS represents the layers in the gate stack of the ferroelectric transistor, consisting a metal (M) gate electrode disposed on a ferroelectric (F) gate dielectric on the silicon (S) channel of the transistor.

However, effective transistor operation of the above MFS transistor is difficult to achieve due to the requirement of the ferroelectric/silicon interface. When a ferroelectric film is deposited directly on the silicon substrate, metals and oxygen from the ferroelectric layer may diffuse into the ferroelectric-silicon interface, creating interface trapped charges which affect the polarization of the ferroelectric film, and overall may make the operation of the ferroelectric transistor unstable. Further, since the thermal expansion coefficient and lattice structure of a ferroelectric film is not compatible with silicon, it is very difficult to form a high-quality ferroelectric film with a clean interface directly on the silicon substrate.

Among the various designs to improve the ferroelectric/silicon interface in ferroelectric memory devices by modifying the interface layer (gate dielectric, Schottky diode formation, conductive oxide), the option of conductive oxide interface layer is very promising since it does not have the drawbacks of a dielectric interface layer, and may not have the drawbacks of the metal interface layer of a Schottky diode formation. The conductive oxide interfacial layer may also improve the quality of the ferroelectric film and the operation of the ferroelectric transistor by possible lattice matching with the ferroelectric layer, reducing or eliminating the oxygen diffusion problem at the ferroelectric interface to improve the reliability of the ferroelectric transistor, and possible etch selectivity improving with other dielectric and metal films. Details of the novel ferroelectric transistor designs employ a conductive oxide, a conductive metal oxide, a doped conductive metal oxide or a semiconductor metal oxide interfacial layer are disclosed in co-pending application entitled "Conductive metal oxide gate ferroelectric memory transistor", "$In_2O_3$ thin film resistivity control by doping metal oxide insulator for MFMox device applications", and "Semiconductive metal oxide thin film ferroelectric memory transistor" of the same first inventors, hereby incorporated by reference.

Since the ferroelectric material is highly susceptible to degradation by impurity incorporation such as oxygen diffusion, the fabrication process of ferroelectric memory devices often includes an encapsulate layer to the ferroelectric material with silicon nitride being the most commonplace material for ferroelectric encapsulation. With the introduction of conductive oxide replacing the gate dielectric, the fabrication process of ferroelectric memory devices would require novel processes to ensure a proper fabrication of the transistor, in particular a selective etch process between the silicon nitride and the conductive oxide material.

SUMMARY OF THE INVENTION

The present invention provide a selective etch process of $Si_3N_4$ over conductive oxide by employing an oxygen additive. The presence of oxygen in the etch gas mixture increases the etch rate of silicon nitride and also decreases the etch rate of conductive oxide, resulting in a significant etch selectivity improvement of silicon nitride over conductive oxide. The mechanism of conductive oxide etch selectivity in the present invention might be different than prior art silicon oxide's where the etch selectivity of nitride over oxide is also improved with oxygen additive. However, etch selective improvement of silicon oxide with oxygen additive is credited to the reduction of polymer formation, thus the etch rate of silicon oxide would not be reduced with the addition of oxygen. In contrast, conductive oxide behaves differently than silicon oxide, and its etch selectivity to other dielectric films might be intrinsic since the steam pressure of conductive oxide is typically very high. The effect of oxygen additive could be more than the suppression of polymer since the etch rate of conductive oxide is also reduced with the addition of oxygen.

The oxygen additive comprises between 1-15% by volume of the etch gas mixture with the etch gas mixture typically contains a chlorine or fluorine compound. The etching process is preferably carried out in a plasma reactor where the plasma generator can be parallel plate or inductive couple plasma. The reactor also can incorporate DC or RF wafer bias.

The present invention selective etching of $Si_3N_4$ over conductive oxide such as $In_2O_3$ can be applicable for silicon nitride spacer formation on a surface of $In_2O_3$ layer to minimize the overetched damage to the conductive oxide. The spacer formation of $Si_3N_4$ over $In_2O_3$ is well suited for ferroelectric memory transistor fabrication process with $Si_3N_4$ surrounding the ferroelectric material to prevent degradation of the ferroelectric material.

DETAILED DESCRIPTION OF THE INVENTION

Figure 1A:
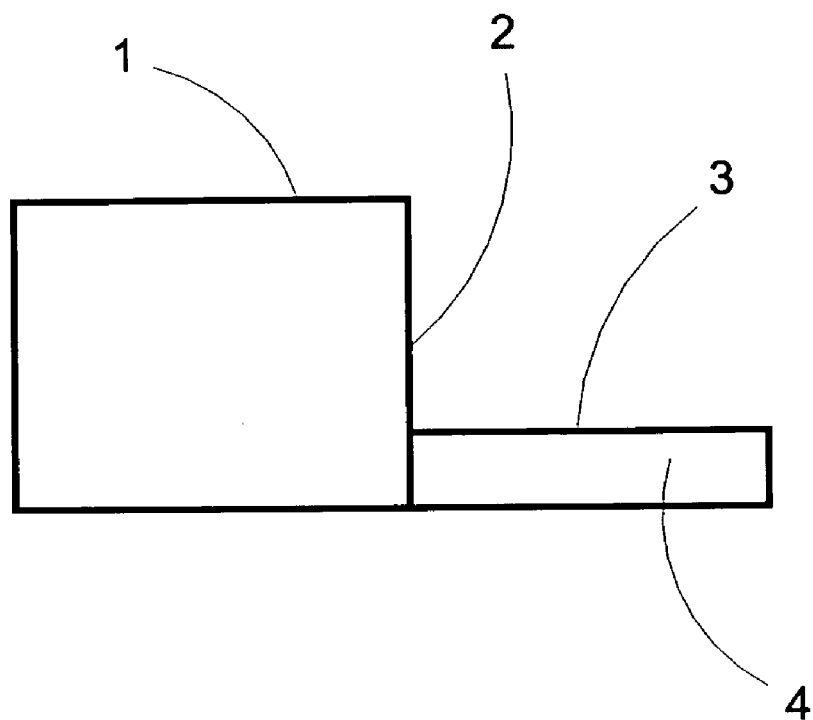
FIGS. 1A-D show a process flow of silicon nitride spacer formation.
Figure 1B:
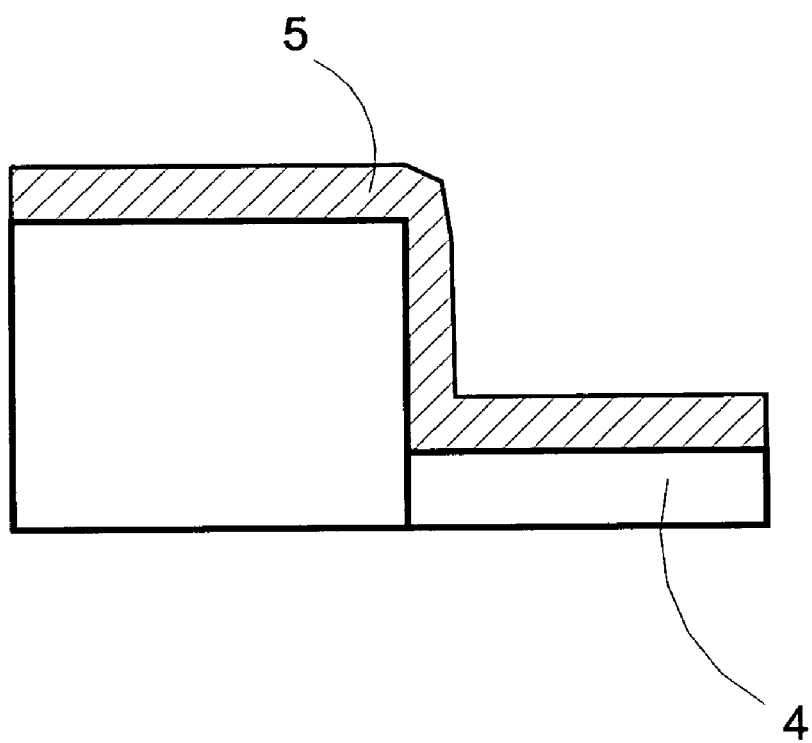
Figure 1C:
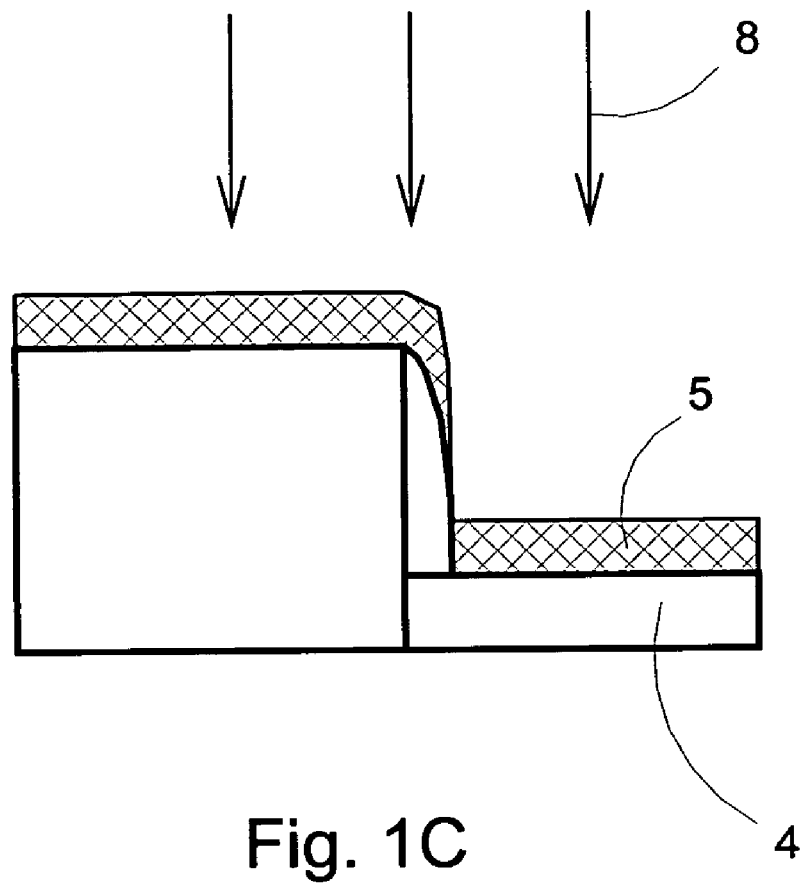
Figure 1D:
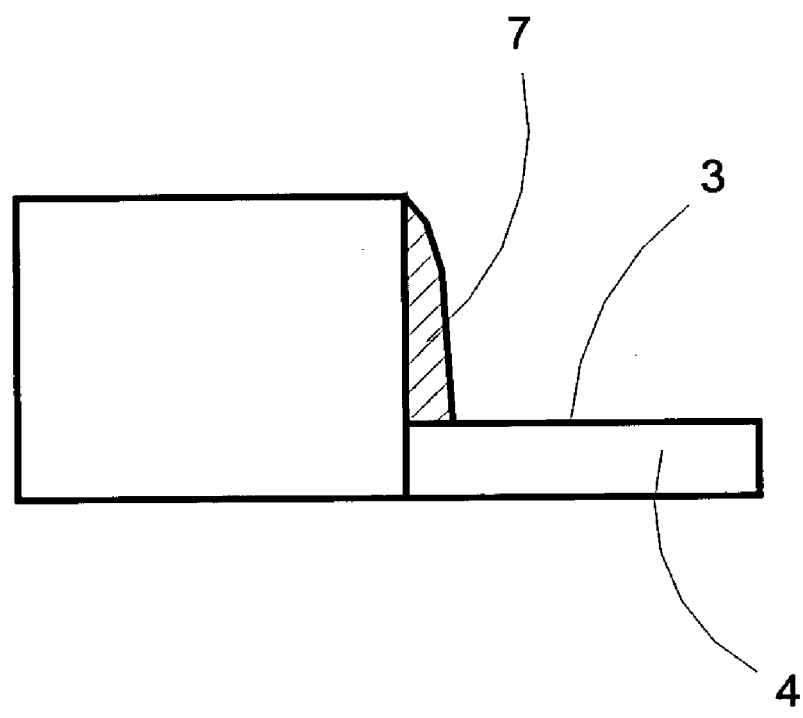

The present invention discloses a selective etch process between silicon nitride and conductive oxide materials, applicable for the fabrication of semiconductor devices, especially for ferroelectric memory transistors employing conductive oxide. Using the present invention etch selectivity method, silicon nitride spacers encapsulated the ferroelectric material can be fabricated with less damage to the conductive oxide layer. The conductive oxide used in the present invention is broadly defined as an oxide that is not a dielectric, including conductive metal oxide, doped conductive oxide, doped conductive metal oxide, semiconductive oxide and semiconductive metal oxide materials.

Briefly, the present invention comprises an etch gas mixture having an oxygen additive wherein the oxygen comprises between 1-15% by volume of the etch gas mixture. The etch gas mixture typically contains chlorine or fluorine compound such as $C_4F_8$, $CF_4$, $C_2F_6$, $CHF_3$, $C_3F_6$, $C_4F_6$, $C_5F_8$, $Cl_2$, $CF_2Cl_2$, $CF_3Br$, $CF_3Br$, $C_2F_5Cl$, $C_2F_5Cl$, $CCl_4$, $PCl_3$, $BCl_3$, $SiCl_4$, or any mixture combinations. The etch gas mixture may further include a non-reactive gas such as argon, helium, neon or nitrogen. Hydrogen or bromium compounds might also be added to the etch gas mixture. The oxygen additive can be a strong oxidant or a weak oxidant with the oxidant is selected from the group consisting of CO, $CO_2$, $O_2$, $H_2O$ vapor, NO, and $N_2O$.

Etching is a common step in the integrated circuit fabrication processes in which material is removed uniformly, with or without a masking pattern, from a wafer during the manufacture of semiconductor devices. Etching could serve to clean the wafer surface or to shape the wafer into appropriate device structures. In general, the goal of etching is to remove a portion of material from a wafer substrate as desired for the particular application. It is also important during wafer processing to be able to etch materials selectively, i.e. to be able to etch one material at a much faster rate than another material. Therefore the disclosed etch selectivity of silicon nitride versus conductive oxide of the present invention offers much versatility in the fabrication of ferroelectric memory devices using conductive oxide material. The process yields a high etch rate selectivity of silicon nitride to conductive oxide and thereby provides an advantage in the fabrication of the encapsulation of silicon nitride surrounding the ferroelectric material layer.

It is reported that silicon nitride and silicon oxide can be selectively plasma etched using mixtures of $CF_4+CF_2Cl_2+O_2$, $CF_4+CF_3Br+O_2$, or $CF_4+CF_3Br+NO$. It has been suggested that adding a small amount of oxygen in the etch gas mixture increases the selectivity of silicon oxide with respect to silicon nitride due to the suppressing of the formation of fluorocarbon polymers. This technique is based on the thought that oxygen radicals can remove carbon, thus increasing the F/C ratio and thereby preventing polymer deposition. In general, the $Si_3N_4$ to $SiO_2$ etch ratio improves with increasing oxygen content in the etch gas mixture. However, the suppression of polymer formation affects the etch rate of both $Si_3N_4$ and $SiO_2$, and consequently, the optimum etch selectivity improvement of $Si_3N_4$ and $SiO_2$, defined as an etch selectivity improvement in which the $Si_3N_4$ etch rate increases and the $SiO_2$ etch rate decreases, is not achieved.

The present invention provide an optimum etch selectivity improvement of $Si_3N_4$ over conductive oxide by employing an oxygen additive. The process comprises an etch gas mixture comprising an oxidant and a fluorine or chlorine compound. It is preferred that the etch mixture is 10%-50% $C_4F_8$, 50%-90% $Cl_2$, and 1%-15% $O_2$ by volume, even though other fluorine or chlorine or oxidant compounds may be used. The addition of oxygen in the present invention not only increases the etch rate of silicon nitride but also reduces the etch rate of conductive oxide, resulting in an optimum etch selectivity improvement of silicon nitride over conductive oxide. Conductive oxide behaves differently than silicon dioxide since a steam pressure of conductive oxide is typically very high, and therefore it can be etched with high selective to other dielectric films. In addition, the conductive metal oxide and the metal can have high selective etching rate since the conductive metal oxide films ($RuO_2$, for example) normally cannot easily react with halogen such as F and Cl used for etching the metal films.

The dry etching process can be carried out in a reactive ion etch reactor. The reactor can be tunnel-type plasma etchers, parallel plate plasma etchers, and high density inductive couple plasma etchers. The reactor also can incorporate DC or RF wafer bias to control the plasma properties. For example, with the wafer bias independently controlled, the ion energy can be highly tunable in high density plasma to provide better control of etch selectivity. The plasma in the present selective etch process can be generated with a RF or microwave field. The frequency of the generated RF field is preferably in the range of approximately 400 kHz to 13.6 MHz, or a combination of multiple frequencies such as both 13.6 MHz and 400 kHz. The lower frequency field is normally generated in the vicinity of the wafer support cathode, and the higher frequency field is normally generated in the vicinity of the plasma above the wafer. The frequency of the microwave plasma is microwave frequency, and a combination of RF and microwave field for plasma generation is also applicable. The power of the applied RF field is typically less than 500 W and preferably between 100 to 300 W, such as 200 W. The power of the applied microwave field is typically less than 1200 W and preferably between 400 to 800 W, such as 600 W.

In a preferred embodiment of the present invention, a wafer is first positioned in a process chamber, then the etchant gas mixture is introduced to maintain a pressure of less than 100 milliTorrs, preferably less than about 20 mTorr, such as 6 mTorr. The etchant mixture comprises an etch gas of fluorine or chlorine compounds together with an oxygen additive. The etchant mixture is then excited by exposing the gas to a plurality of plasma power sources (typically at different frequencies such low frequency RF, high frequency RF, microwave). An optional RF or DC power source can also be applied to control the bias of the plasma on the wafer structure to force the electric potential gradient to a desired magnitude and polarity.

The following etching process has been developed for patterning and etching of $Si_3N_4$ with less over etching of $In_2O_3$ material. Shown in Table 1 are the etching conditions and the etching rates of $In_2O_3$ and $Si_3N_4$.

TABLE 1

The chemistry, etching conditions and etch rates of $In_2O_3$ and $Si_3N_4$.

| | $C_4F_8$ (sccm) | $Cl_2$ (sccm) | $O_2$ (sccm) | Microwave FP (W) | RF FP (W) | Pressure (mTorr) | $Si_3N_4$ dep rate (nm/min) | $In_2O_3$ dep rate (nm/min) |
|---|---|---|---|---|---|---|---|---|
| Recipe A | 30 | 60 | 0 | 600 | 200 | 6 | 360 | 80 |
| Recipe B | 30 | 60 | 5 | 600 | 200 | 6 | 400 | 60 |

Using recipe A without oxygen, the etching rates for $In_2O_3$ and $Si_3N_4$ are 80 nm/minute and 360 nm/minute respectively. Adding 5% oxygen as in recipe B, the etching rate of $Si_3N_4$ increases to 400 nm/minute and the etching rate for $In_2O_3$ decreases to 60 nm/minute. Therefore adding oxygen to the etch gas mixture can improve significantly the etch selectivity of $Si_3N_4$ over $In_2O_3$. The selectivity can be further adjusted by changing gas flows, source power and other process parameters such as pressure or etching compounds to optimize the selectivity of silicon nitride over conductive oxide on a particular substrate.

$In_2O_3$ is a typical conductive oxide material which is defined as an oxide that is not a dielectric. The above example illustrates the specific results of the etch selectivity of silicon nitride over indium oxide, but in general, the present invention is applicable for improved etch selectivity of silicon nitride over various conductive oxide materials. The conductive oxide disclosed in the present invention can also be a conductive metal oxide which is preferably an oxide film of any one metal selected from a group of Mo, W, Tc, Re, Ru, Os, Rh, Ir, Pd, Pt, In, Zn, Sn, Sr—Ru or Sr—Co (such as $IrO_2$ and $RuO_2$), or a rock-salt (NaCl) crystal structure face-centered cubic metal oxide, such as NdO, NbO, SmO, LaO, and VO. The preferred method of forming the conductive oxide is by deposition. However, other methods may be used such as doping by diffusion and ion implantation. For example, the conductive oxide can be boron (B) doped or fluorine (F) doped ZnO and antimony (Sb) doped or fluorine (F) doped $SnO_2$. The conductive oxide may be composed of any number of conductive perovskite oxides such as lanthanum strontium cobalt oxide (LSCO). Typical examples of simple perovskite oxides are expressed by the general formula $ABO_3$ such as $SrRuO_3$ or $LaNiO_3$, where AB can be any combination of (A=Ca, Sr)(B=V, Cr, Fe, Ru), (A=La)(B=Ti, Co, Ni, Cu), (A=H, Li, Na, K)(B=Re, Mo, Nb), (A=La1−xSrx)(B=V, Mn, Co). Another example of conductive perovskite oxides is expressed by the general formula $A_2B_2O_7$ where (A=Bi, Pd)(B=$Ru_{1-x}Bi_x$, $Ru_{1-x}Pb_x$). Examples of layered perovskite oxides include CaTiO, $(Sr(Ru, Ir, Cr)O_3)(SrO)_n$ such as $SrRuO_3$, $SrIrO_3$, $Sr_2RuO_4$, $Sr_2IrO_4$ and $Ba_2RuO_4$. The conductive oxide film can also include high temperature superconducting oxides such as $La_{1-x}Sr_xCuO_4$, $Nd_{1-x}Ce_xCuO_4$, $YBa_2Cu_3O_7$, $Bi_2Sr_2Ca_{n-1}Cu_nO_{2n+4}$, $(Nd_{1-x}Ce_x)_2CuO_4$.

The conductive oxide can further be doped with an impurity to modify the resistivity. The impurity species is preferably an insulator material, and amorphously distributed throughout the conductive oxide film. The impurity species is preferably an element or its non-conductive oxide such as hafnium or hafnium oxide ($HfO_2$ and its variants of oxygen-rich or oxygen-deficiency $HfO_x$), zirconium or zirconium oxide ($ZrO_2$ and its variants of oxygen-rich or oxygen-deficiency $ZrO_x$), lanthanum or lanthanum oxide ($LaO_2$ and its variants of oxygen-rich or oxygen-deficiency $LaO_x$), or aluminum or aluminum oxide ($Al_2O_3$ and its variants of oxygen-rich or oxygen-deficiency $AlO_x$). The conductive oxide is most preferred to be $In_2O_3$ with the dopant species being hafnium, zirconium, lanthanum, aluminum or their oxides. Doping the conductive oxide with an element, for example hafnium, will likely generate hafnium oxide due to the presence of oxygen in the conductive oxide film.

Under appropriate conditions, certain conductive metal oxide materials behave as a semiconductor, and therefore the conductive oxide disclosed in the present invention also includes semiconductive metal oxide materials. The semiconductive metal oxide in the present invention is preferably a metal oxide exhibiting semiconducting properties, such as indium oxide ($In_2O_3$), ruthenium oxide ($RuO_2$), tungsten oxide ($WO_3$), molybdenum oxide ($MoO_3$), titanium oxide ($TiO_2$), tin oxide ($SnO_2$), iron oxide ($Fe_2O_3$), cesium oxide ($CeO_2$), zinc oxide ($ZnO_2$), gallium oxide ($Ga_2O_3$), SrTiO, $LaFeO_3$, $Cr_{1.8}Ti_{0.2}O_3$.

The selective etching of $Si_3N_4$ over $In_2O_3$ as disclosed by the present invention is well applicable for $Si_3N_4$ spacer formation on a surface of $In_2O_3$ layer as shown in the fabrication process of FIG. 1. FIG. 1A shows a step structure having a top surface 1, a substantially vertical surface 2 and a bottom surface 3. The bottom surface is the surface of a conductive oxide layer 4, and the surfaces 1 and 2 can be of any material such as silicon oxide. FIG. 1B shows a $Si_3N_4$ layer 5 forming over the step structure, preferably by deposition such as chemical vapor deposition or plasma-enhanced chemical vapor deposition. FIG. 1C shows the $Si_3N_4$ layer is anisotropically etched 8 by the present invention plasma-enhanced selective etch. The selective etch is preferably anisotropic, and thus a $Si_3N_4$ spacer 7 is formed as in FIG. 1D. Since the selective etch has a higher etch rate for $Si_3N_4$ than for conductive oxide, the $Si_3N_4$ layer 5 can be etched with minimal overetched damage to the conductive oxide layer 4.

The spacer formation of $Si_3N_4$ over $In_2O_3$ is well suited for ferroelectric memory transistor fabrication process in which the ferroelectric material is surrounded by $Si_3N_4$ spacers to prevent the reaction between ferroelectric material and silicon dioxide. The selective etching process of $Si_3N_4$ stopped at $In_2O_3$ thin films as demonstrated above is preferably for $In_2O_3$ FeRAM device applications, but this etching process can be generalized to MFMox (Metal-Ferroelectric-Metal oxide) FeRAM employing conductive oxide material.

Figure 2:
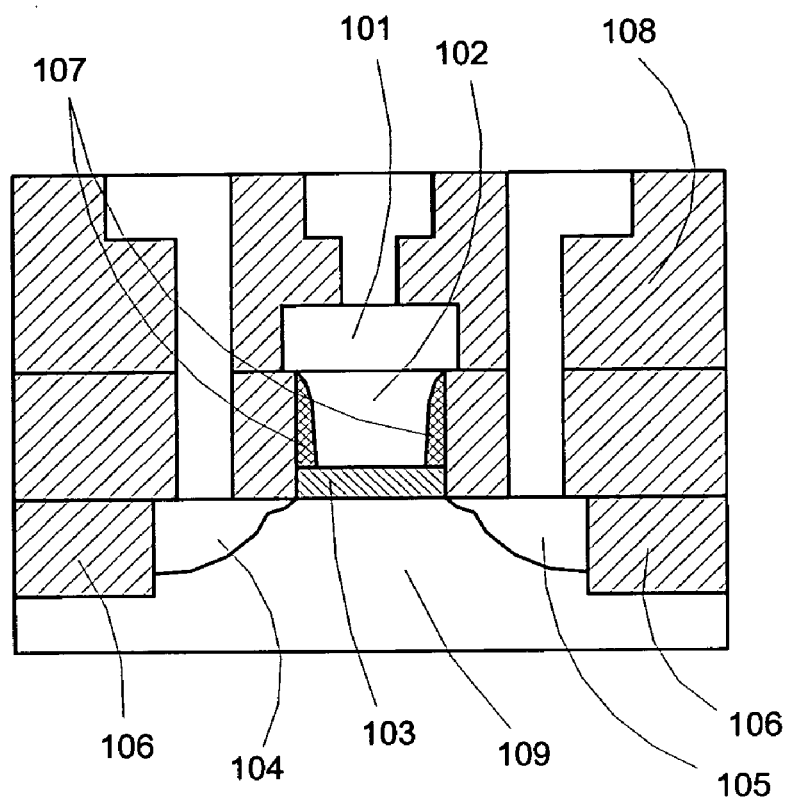
FIG. 2 shows a schematic of a conductive oxide ferroelectric memory transistor.

FIG. 2 shows a typical ferroelectric structure employing a conductive oxide or a resistive oxide, fabricated using gate replacement method, as disclosed in co-pending application entitled "Conductive metal oxide gate ferroelectric memory transistor" and also in another co-pending application entitled "$In_2O_3$ thin film resistivity control by doping metal oxide insulator for MFMox device applications".

Employing a doped conductive oxide film as a gate dielectric for the ferroelectric transistor, FIG. 2 illustrates an n-channel conductive oxide ferroelectric transistor having a gate stack of a top electrode 101, a ferroelectric film 102, and a conductive oxide or a doped conductive oxide 103, positioning on a silicon substrate 109, and disposed between the source 104 and drain 105 regions having a high concentration of impurity ions. The ferroelectric transistor is isolated by the isolation trenches 106 and interlevel dielectric layer 108. The ferroelectric layer 102 is encapsulated by a silicon nitride spacer 107 to maintain the integrity of the ferroelectric property at high temperature processing steps.

Figure 3:
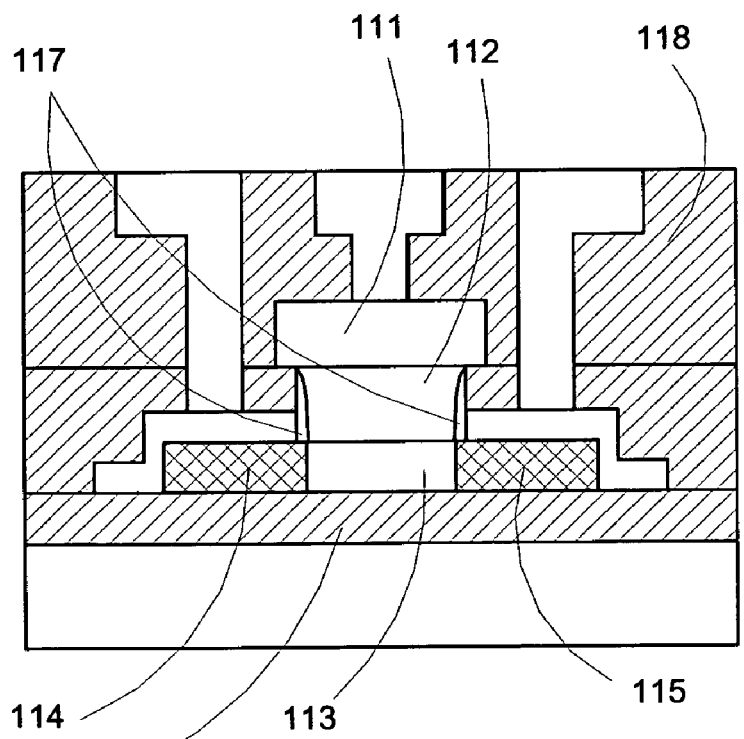
FIG. 3 shows a schematic of a semiconductive oxide ferroelectric memory transistor.

FIG. 3 shows another ferroelectric structure employing a semiconductive oxide channel layer, fabricated using gate replacement method, as disclosed in co-pending application entitled "Semiconductive metal oxide thin film ferroelectric memory transistor". The gate stack of the semiconductive metal oxide ferroelectric transistor comprises a top gate electrode 111 and a ferroelectric film 112, positioning on a semiconductive metal oxide layer 113 disposed on a substrate 119, and disposed between the source 114 and drain 115 regions having a high concentration of opposite type impurity ions. The ferroelectric transistor is isolated by the isolation substrate 119 and interlevel dielectric layer 118. Similar to the other ferroelectric memory transistor design, the ferroelectric layer 112 is encapsulated by a silicon nitride spacer 117.

The ferroelectric material as shown in FIG. 2 and FIG. 3 can be Pb(Zr, Ti)O$_3$(PZT), SrBi$_2$Ta$_2$O$_9$(SBT), Pb$_5$Ge$_3$O$_{11}$ (PGO), BaTiO$_3$, LiNbO$_3$, STO, BST, BSTO, SBTN, PLT or PLZT, but any ferroelectric material exhibiting hysteresis effect can be employed.

The ferroelectric gate stack of FIG. 2 and FIG. 3 may be fabricated by a replacement gate process similar to Hsu et al., U.S. Pat. No. 6,274,421, entitled "Method of making metal gate sub-micron MOS transistor", hereby incorporated by reference. The specific details of the fabrication processes for these ferroelectric designs have been disclosed in co-pending applications mentioned above, and are further described below for a ferroelectric transistor using conductive oxide as a gate dielectric. The fabrication process uses a replacement process to form the gate stack and comprises the steps of:

Preparing a semiconductor substrate
Forming a replacement gate stack comprising a sacrificial layer
Forming drain and source regions on opposite sides of the replacement gate stack
Filling the areas surrounding the replacement gate stack while exposing a top portion of the replacement gate stack
Removing the sacrificial layer portion of the replacement gate stack
Formation of silicon nitride spacer
Forming the remainder of the gate stack.

The device fabrication process is then completed with passivation and interconnect metallization steps.

Figure 4A:
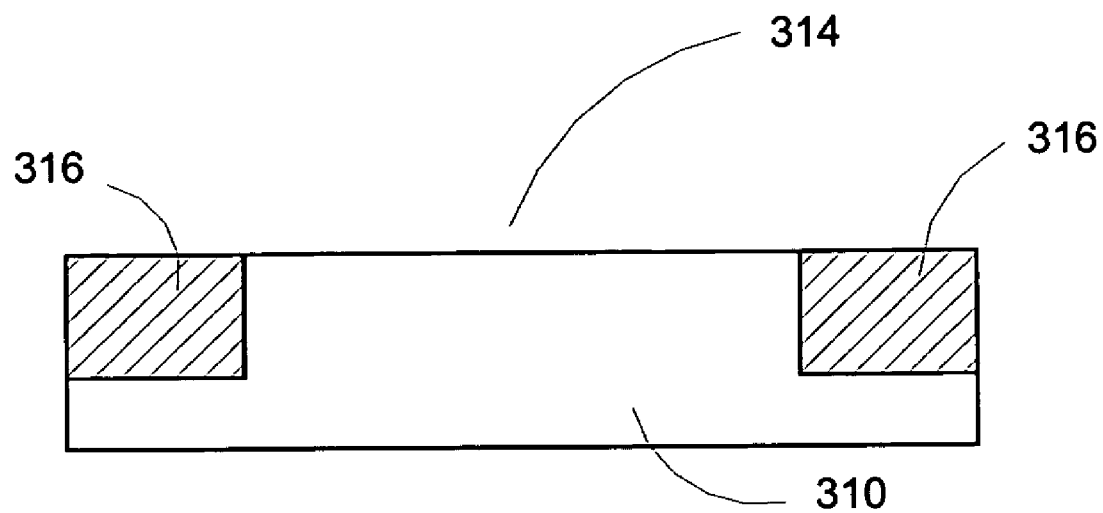
FIGS. 4A-K show a representative fabrication process for replacement gate process of a ferroelectric memory transistor.

Preparing a semiconductor substrate, FIG. 4A:

The fabrication process starts with the preparation of a substrate (p-type or n-type, bulk or silicon-on-insulator, SOI or SIMOX) and any state of the art suitable processes for the well formation and device isolation. FIG. 4A shows a p-type substrate 310 (similar fabrication process can be applied to an n-type substrate with appropriate corrections and adjustments) and shallow trench isolation (STI) 316 to form an active device 314. For simplicity, important but unrelated details is not shown, such as periphery devices, well formation process and active region threshold voltage adjustment.

Figure 4B:
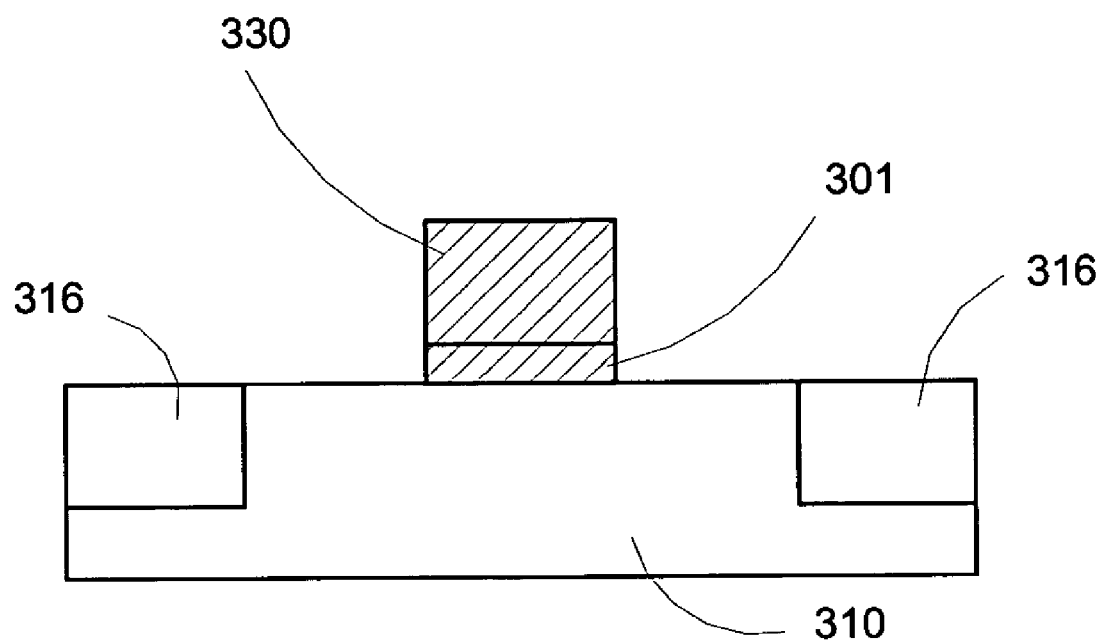

Forming a replacement gate stack comprising a sacrificial layer on the substrate, FIG. 4B:

Then the multilayer replacement gate stack is deposited. The replacement gate stack serves as a place holder for the continued fabrication of the device, and will be removed before the fabrication of the functional gate stack. Thus the multilayer replacement gate stack comprises a conductive oxide layer and a sacrificial gate replacement layer. The conductive oxide is preferably between 10 to 30 nm thick and is preferably In$_2$O$_3$ or RuO$_2$, but can be any conductive materials as disclosed above. The sacrificial gate replacement layer is preferably between about 100 to 300 nm thick and is preferably silicon nitride or silicon dioxide. Since the sacrificial gate replacement layer serves as a place holder for the functional gate stack, the thickness of the sacrificial layer is partially determined by the total thickness of the remainder of the functional gate stack.

The replacement gate stack multilayer is then patterned into a ferroelectric gate stack, comprising a replacement gate layer 330, and a conductive oxide 301 as shown in FIG. 4B. The patterning of the gate stack multilayer is preferably by photolithography and reactive ion etching.

Figure 4C:
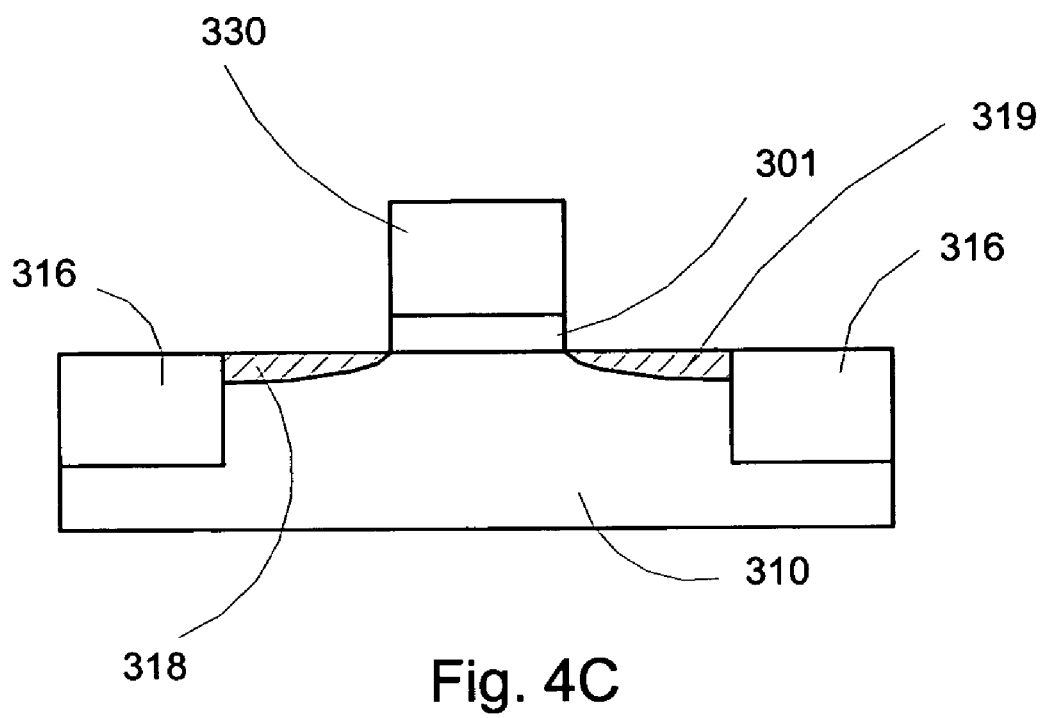

The next step is low doping drain (LDD) ion implantation into source 318 and drain 319 regions, although the ferroelectric memory transistor may or may not requires this LDD ion implantation. LDD implantation includes implantation of phosphorus ions at an energy level of 15 keV to 40 keV, or arsenic ions at an energy level of 30 keV to 60 keV. The doses of the LDD phosphorus or arsenic implantation are about $5 \times 10^{14}$ cm$^{-2}$ to $10^{15}$ cm$^{-2}$ (FIG. 4C).

Figure 4D:
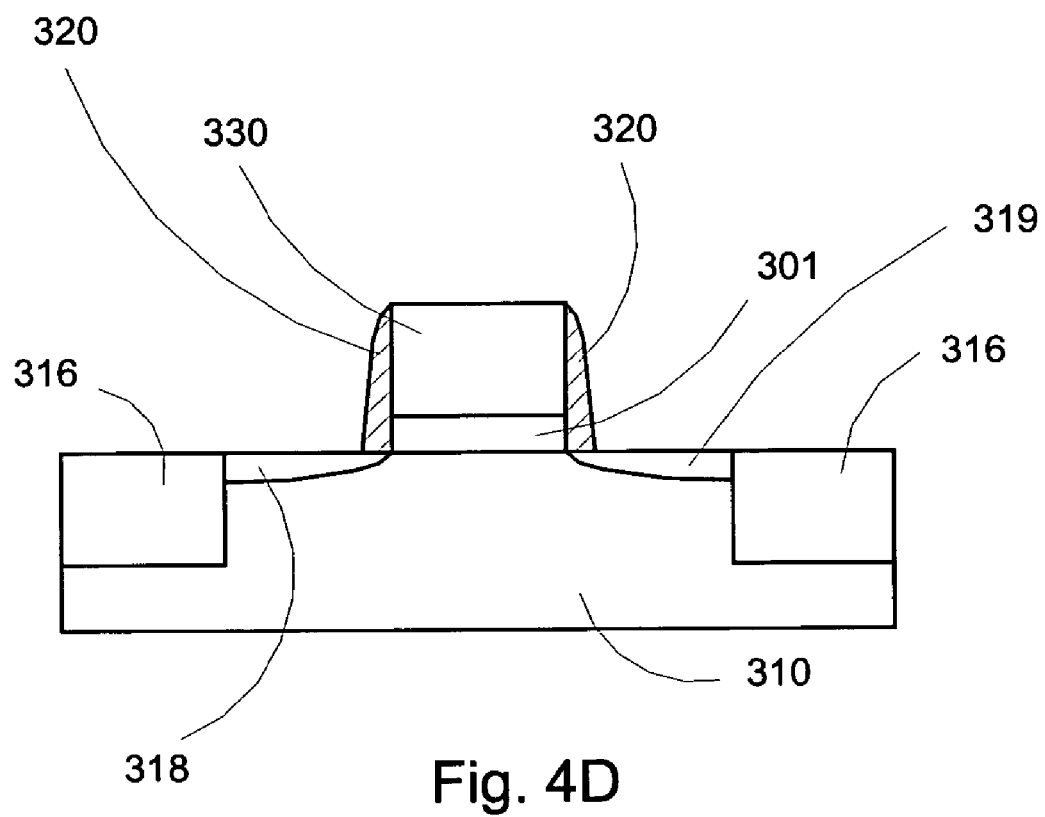

Then a layer of dielectric material such as silicon nitride or silicon dioxide is deposited onto the replacement gate stack to a thickness of about between 20 to 80 nm, and then is anisotropic etched to leave a dielectric sidewall spacer 320 on the ferroelectric gate stack (FIG. 4D).

Figure 4E:
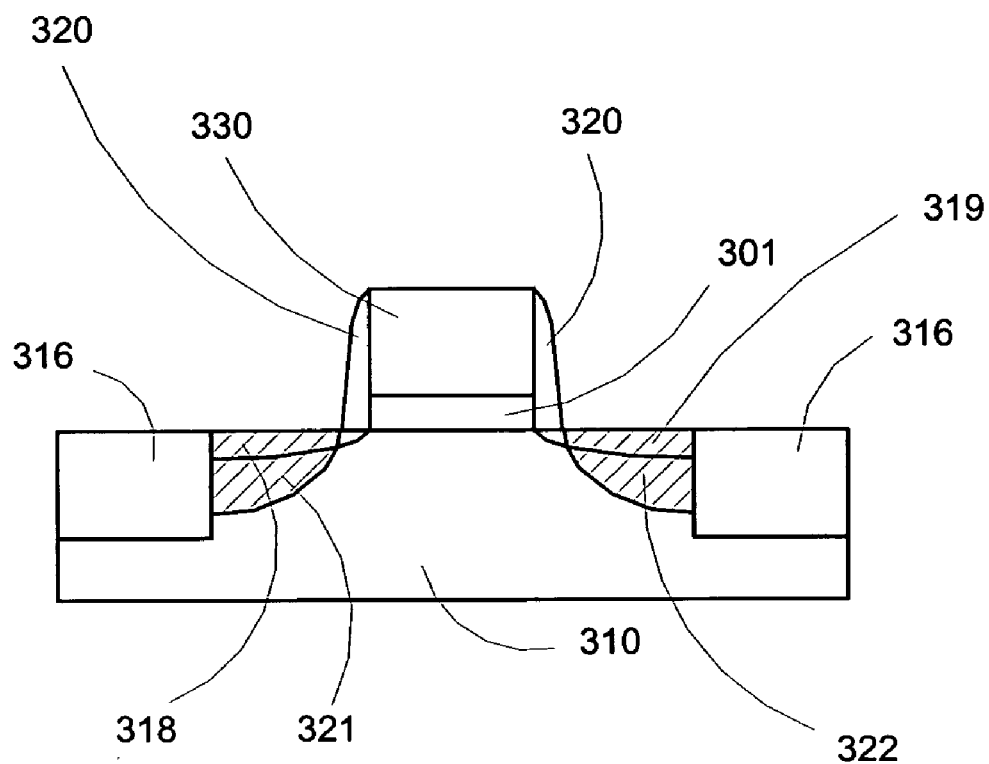

Forming drain and source regions on opposite sides of the replacement gate stack, (FIG. 4E):

Then a source region 321 and a drain region 322 are formed by implantation of doping ions, for example arsenic at a dose of about $10^{15}$ cm$^{-2}$ to $5 \times 10^{15}$ cm$^{-2}$ and at an energy level of 15 keV to 30 keV.

Figure 4F:
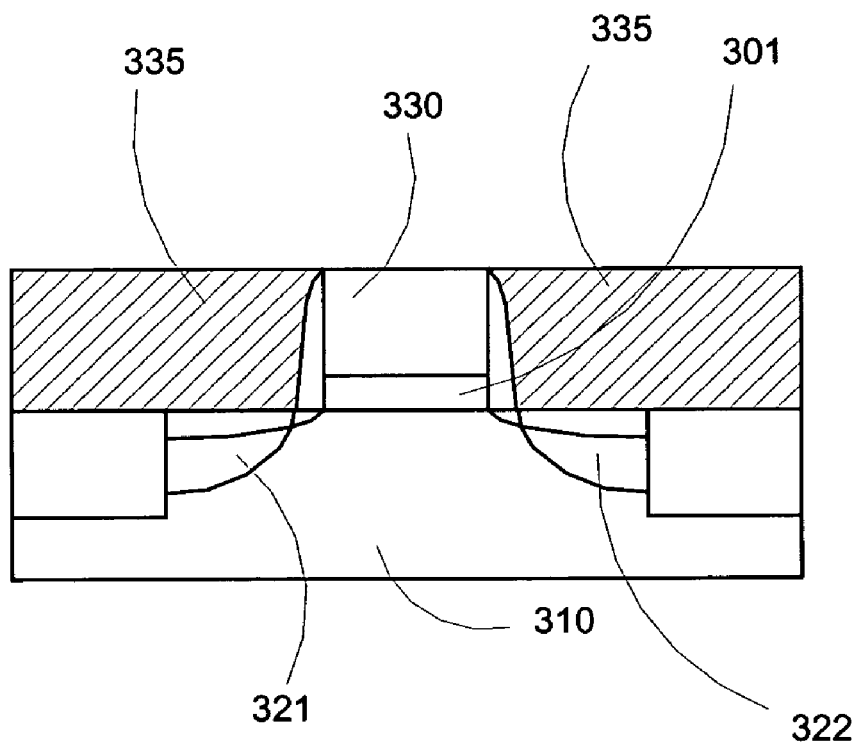

Filling the areas surrounding the replacement gate stack while exposing a top portion of the replacement gate stack, FIG. 4F:

A dielectric layer 335 such as silicon dioxide is deposited on the whole structure. The dielectric layer is then planarized, preferably by a chemical mechanical polishing (CMP) process. The thickness of the dielectric layer is preferably about 50% thicker than the replacement gate layer 330 to prevent dishing during planarization.

Figure 4G:
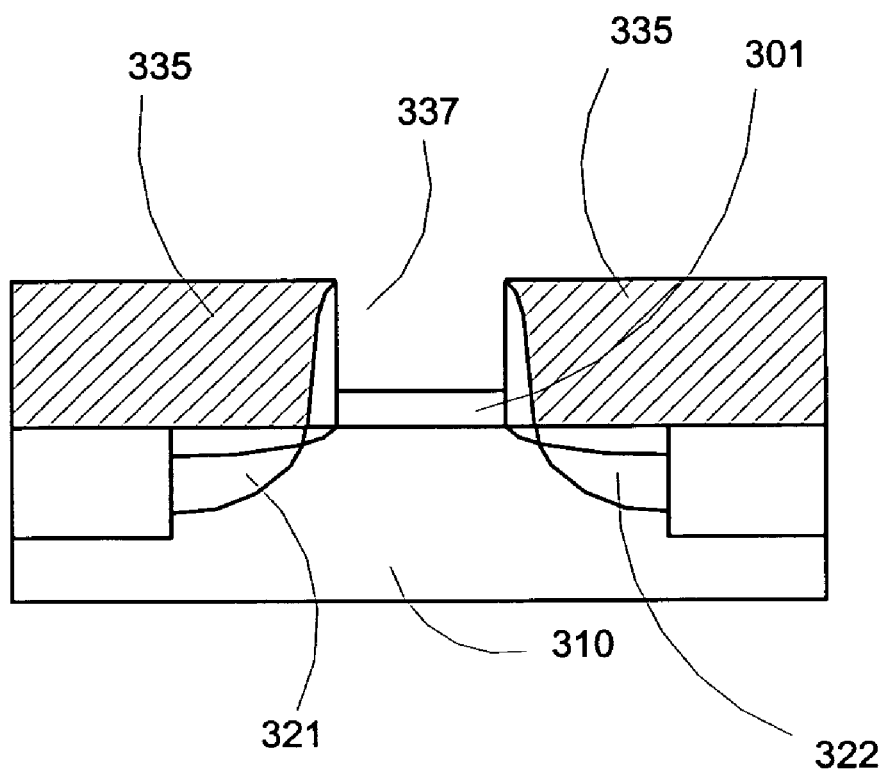

Removing the sacrificial layer portion of the replacement gate stack, FIG. 4G:

The replacement gate layer 330 is removed to expose a gate trench 337, preferably by a wet etch process to prevent damage to the surrounding structure.

Figure 4H:
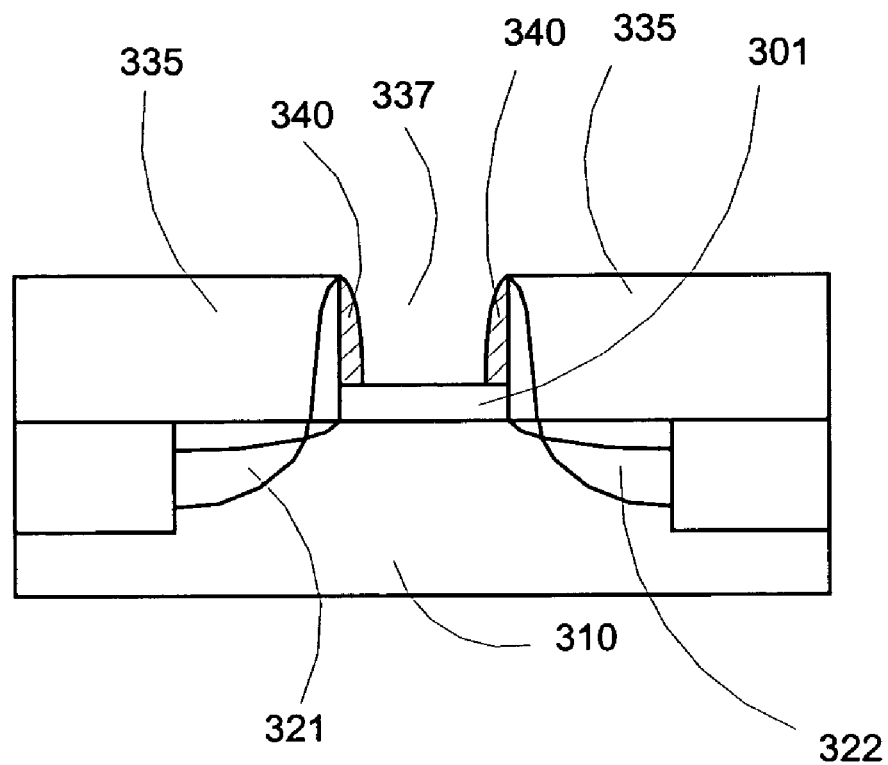

Formation of silicon nitride spacer, FIG. 4H

A silicon nitride spacer 340 is then formed in the sidewall of the gate trench. The spacer formation is fabricated by depositing a layer of silicon nitride of about 10 to 30 nm thick, and then anisotropically etched, stopping on the conductive oxide layer (FIG. 4H). The anisotropic etch step is preferably according to the present invention plasma-enhanced selective etch of silicon nitride over conductive oxide.

Figure 4I:
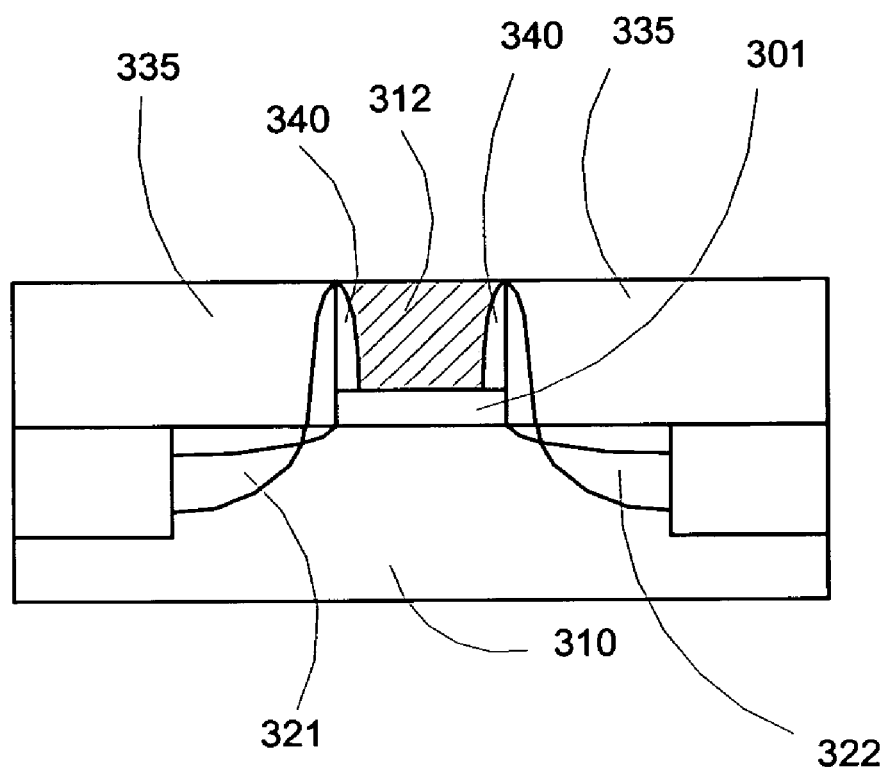

Forming the remainder of the gate stack, FIG. 4I:

The ferroelectric layer is then deposited into the gate trench. The ferroelectric layer is preferably PGO, BST or PZT, but can be any ferroelectric material exhibiting hysteresis effect. The thickness of the ferroelectric layer is preferably slightly thicker than the depth of the gate trench to minimize the dishing effect during the subsequent CMP process of planarize the ferroelectric layer 312.

The top electrode 313 is then fabricated on the ferroelectric layer 312. The top electrode formation is preferably by depositing a blanket layer of top electrode material, and then is patterned into the top electrode, preferably by photo lithography and reactive ion etching techniques. The top electrode is preferably between 50 to 200 nm thick and is preferably aluminum, platinum or iridium, but also can be any conductive materials.

Figure 4J:
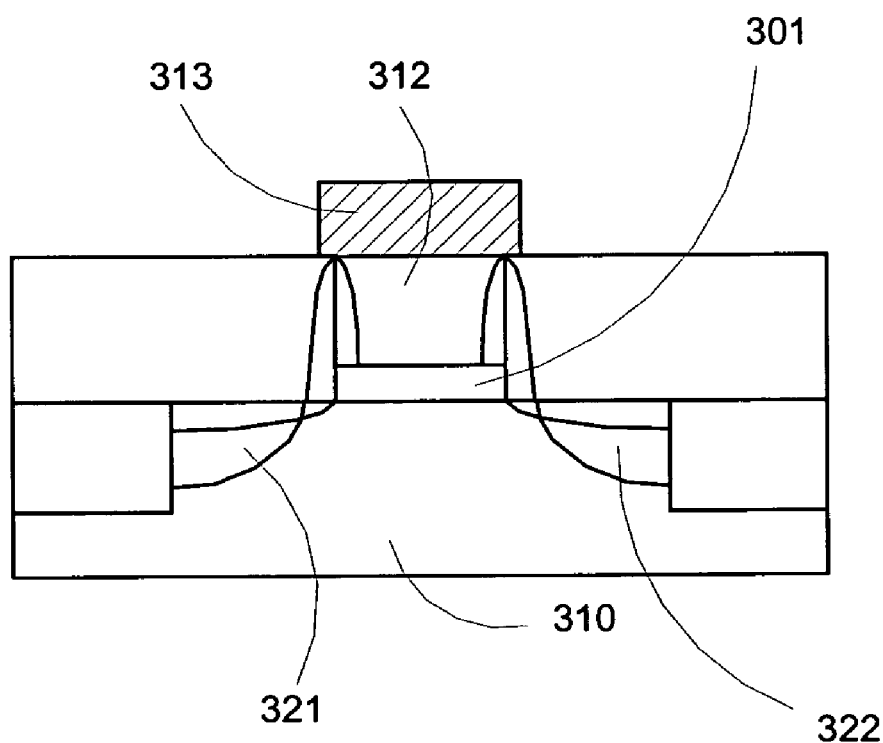
Figure 4K:
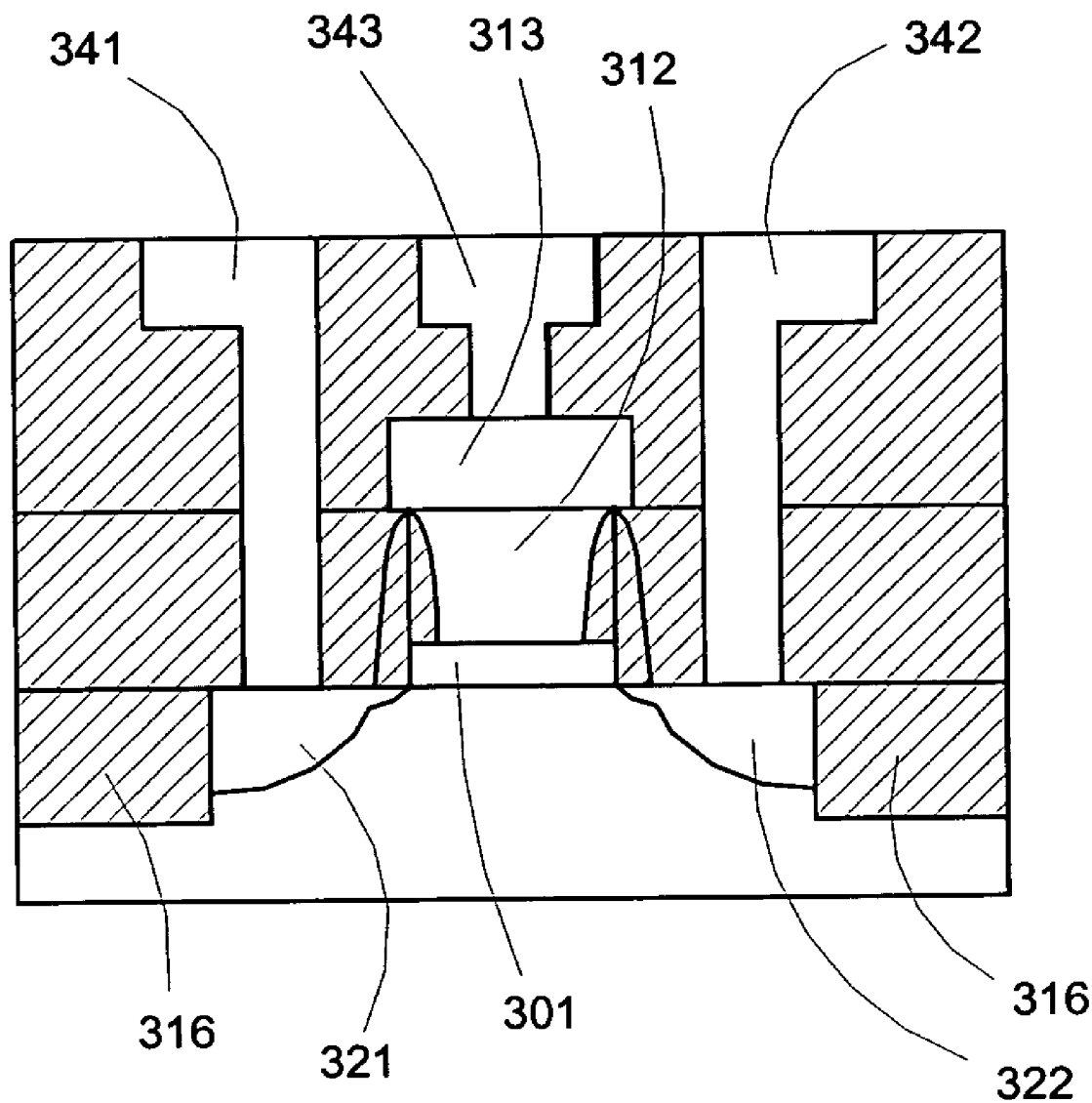

The device fabrication process is then completed with passivation and interconnect metallization steps, FIG. 4J. A passivation layer such as silicon dioxide is deposited on the whole structure to a thickness of about 300 to 500 nm. The structure is then annealed at a temperature of between about 400° C. to 500° C. for about 15 to 60 minutes. The passivation layer is then patterned, preferably by photolithography, to form contact holes, and then the fabrication process continued with first level metallization contact 341 to source 321, contact 343 to gate stack (top electrode 313, ferroelectric 312, bottom electrode 311 and conductive oxide 301), contact 342 to drain 322.

In the above process flow, the present invention etch process is well suited to the etching of the silicon nitride to form the spacers (FIG. 4H). The high selectivity of the silicon nitride with respect to the conductive oxide allow the clear of the silicon nitride layer with minimum damage to the conductive oxide bottom layer so that the conductive oxide can have a good interface with the subsequently deposited ferroelectric layer.

Thus a novel selective etching process of silicon nitride and conductive oxide has been disclosed, together with the application to ferroelectric memory transistor fabrication. It will be appreciated that though preferred embodiments of the invention have been disclosed, further variations and modifications thereof may be made within the scope of the invention as defined in the appended claims. Further, although the invention has been described with reference to a ferroelectric transistor for use with nonvolatile memory applications, other applications of the inventive concepts disclosed herein will also be apparent to those skilled in the art.

What is claimed is:

1. A selective etching process for silicon nitride in the presence of conductive oxide, the selective etching process comprising
   providing an etch body comprising silicon nitride and conductive oxide; and
   exposing the etch body to a gaseous plasma prepared from an oxygen-containing source gas and a etch gas mixture containing fluorine or chlorine to etch the silicon nitride at a higher rate than the conductive oxide.

2. A selective etching process as in claim 1 wherein the etch gas mixture comprises a mixture of $C_4F_8$ and $Cl_2$.

3. A selective etching process as in claim 1 wherein the etch gas mixture comprises a mixture of $C_4F_8$ in the range of 10 to 50% and $Cl_2$ in the range of 50 to 90%.

4. A selective etching process as in claim 1 wherein the oxygen-containing gas is in the range of 1 to 15%.

5. A selective etching process as in claim 1 wherein the etch gas mixture comprises $C_4F_8$, $CF_4$, $C_2F_6$, $CHF_3$, $C_3F_6$, $C_4F_6$, $C_5F_8$, $Cl_2$, $CF_2Cl_2$, $CF_3Br$, $CF_3Br$, $C_2F_5Cl$, $C_2F_5Cl$, $CCl_4$, $PCl_3$, $BCl_3$, $SiCl_4$, or any mixture combinations thereof.

6. A selective etching process as in claim 1 wherein the oxygen-containing source gas comprising CO, $CO_2$, $O_2$, $H_2O$ vapor, NO, or $N_2O$.

7. A selective etching process as in claim 1 wherein the plasma comprises an RF plasma having power in the range of 50 to 500 W.

8. A selective etching process as in claim 1 wherein the plasma comprises a microwave plasma having power in the range of 400 to 800 W.

9. A selective etching process as in claim 1 wherein the plasma source comprises a RF or DC source biasing a substrate supporting the etch body.

10. A selective etching process as in claim 1 wherein the pressure of the gaseous plasma is less than 100 mTorr.

11. A selective etching process as in claim 1 wherein the conductive oxide is selected from a group consisted of indium oxide, ruthenium oxide, tungsten oxide, molybdenum oxide, titanium oxide, iron oxide, tin oxide, zinc oxide, $CeO_2$, $Ga_2O_3$, $SrTiO_3$, $LaFeO_3$, $CrxTiyO_3$.

12. A selective etching process as in claim 1 wherein the conductive oxide comprises a conductive perovskite oxide, a high temperature superconducting oxide, or an oxide film of any metal selected from a group consisted of Mo, W, Tc, Re, Ru, Os, Rh, Ir, Pd, Pt, In, Zn, Sn, Nd, Nb, Sm, La, and V.

13. A method of fabricating silicon nitride spacers on a conductive oxide layer surface comprising
   providing a step structure having a top surface, a substantially vertical surface and a bottom surface, the bottom surface being the surface of a conductive oxide layer;
   forming a layer of silicon nitride over the step structure; and
   anisotropically plasma-enhanced etching the layer of silicon nitride over the top surfaces and over the bottom surface with an etchant comprising an oxygen-containing source gas and an etch gas mixture containing fluorine or chlorine to etch the silicon nitride at a higher rate than the conductive oxide to result in silicon nitride spacers on the step structure.

14. A selective etching process as in claim 13 wherein the etch gas mixture comprises a mixture of $C_4F_8$ in the range of 10 to 50% and $Cl_2$ in the range of 50 to 90%.

15. A selective etching process as in claim 13 wherein the oxygen-containing gas is in the range of 1 to 15%.

16. A selective etching process as in claim 13 wherein the etch gas mixture comprises $C_4F_8$, $CF_4$, $C_2F_6$, $CHF_3$, $C_3F_6$, $C_4F_6$, $C_5F_8$, $Cl_2$, $CF_2Cl_2$, $CF_3Br$, $CF_3Br$, $C_2F_5Cl$, $C_2F_5Cl$, $CCl_4$, $PCl_3$, $BCl_3$, $SiCl_4$, or any mixture combinations thereof.

17. A selective etching process as in claim 13 wherein the oxygen-containing source gas comprising CO, $CO_2$, $O_2$, $H_2O$ vapor, NO, or $N_2O$.

18. A selective etching process as in claim 13 wherein the conductive oxide is selected from a group consisted of indium oxide, ruthenium oxide, tungsten oxide, molybdenum oxide, titanium oxide, iron oxide, tin oxide, zinc oxide, $CeO_2$, $Ga_2O_3$, $SrTiO_3$, $LaFeO_3$, $CrxTiyO_3$.

19. A selective etching process as in claim 13 wherein the conductive oxide comprises a conductive perovskite oxide, a high temperature superconducting oxide, or an oxide film of any metal selected from a group consisted of Mo, W, Tc, Re, Ru, Os, Rh, Ir, Pd, Pt, In, Zn, Sn, Nd, Nb, Sm, La, and V.

20. A method of fabricating a ferroelectric memory transistor comprising preparing a semiconductor substrate;
forming a recess gate stack on the substrate, the recess gate stack comprising
a conductive oxide layer overlying the substrate, the conductive oxide layer being recessed and surrounded by an isolation layer with the top surface of the conductive oxide layer exposed;
forming a layer of silicon nitride over the isolation layer and over the conductive oxide exposed surface;
forming silicon nitride spacers by plasma-enhanced selective etching the silicon nitride with respect to the conductive oxide with an etchant comprising an oxygen-containing source gas and a etch gas mixture containing fluorine or chlorine to etch the silicon nitride at a higher rate than the conductive oxide; and
forming a ferroelectric material layer over the conductive oxide layer, the ferroelectric material layer being surrounded by the silicon nitride spacers.

21. A method as in claim 20 wherein the recess gate stack formation comprises
forming a replacement gate stack comprising
a conductive oxide layer overlying the substrate; and
a sacrificial layer over the conductive oxide layer;
forming drain and source regions on opposite sides of the replacement gate stack;
filling the areas surrounding the replacement gate stack while exposing the top portion of the replacement gate stack; and
removing the sacrificial layer portion of the replacement gate stack.

22. A method as in claim 20 further comprising
a top electrode conductive layer over the ferroelectric material layer.

23. A method as in claim 21 wherein the filling of the areas surrounding the replacement gate stack while exposing a top portion of the replacement gate stack comprises the deposition of a dielectric film; and
the planarization of the deposited dielectric film to expose the top portion of the replacement gate stack.

24. A method as in claim 21 wherein the formation of the replacement gate stack comprises the deposition of the replacement gate stack, the photolithography patterning of the replacement gate stack and the etching of the replacement gate stack.

25. A selective etching process as in claim 20 wherein the etch gas mixture comprises a mixture of $C_4F_8$ in the range of 10 to 50% and $Cl_2$ in the range of 50 to 90%.

26. A selective etching process as in claim 20 wherein the oxygen-containing gas is in the range of 1 to 15%.

27. A selective etching process as in claim 20 wherein the etch gas mixture comprises $C_4F_8$, $CF_4$, $C_2F_6$, $CHF_3$, $C_3F_6$, $C_4F_6$, $C_5F_8$, $Cl_2$, $CF_2Cl_2$, $CF_3Br$, $CF_3Br$, $C_2F_5Cl$, $C_2F_5Cl$, $CCl_4$, $PCl_3$, $BCl_3$, $SiCl_4$, or any mixture combinations thereof.

28. A selective etching process as in claim 20 wherein the oxygen-containing source gas comprising CO, $CO_2$, $O_2$, $H_2O$ vapor, NO, or $N_2O$.

29. A selective etching process as in claim 20 wherein the conductive oxide is selected from a group consisted of indium oxide, ruthenium oxide, tungsten oxide, molybdenum oxide, titanium oxide, iron oxide, tin oxide, zinc oxide, $CeO_2$, $Ga_2O_3$, $SrTiO_3$, $LaFeO_3$, $CrxTiyO_3$.

30. A selective etching process as in claim 20 wherein the conductive oxide comprises a conductive perovskite oxide, a high temperature superconducting oxide, or an oxide film of any metal selected from a group consisted of Mo, W, Tc, Re, Ru, Os, Rh, Ir, Pd, Pt, In, Zn, Sn, Nd, Nb, Sm, La, and V.

* * * * *